United States Patent
Hegde et al.

(10) Patent No.: US 11,901,167 B2
(45) Date of Patent: Feb. 13, 2024

(54) ION BEAM DEPOSITION TARGET LIFE ENHANCEMENT

(71) Applicant: Plasma-Therm NES LLC, St. Petersburg, FL (US)

(72) Inventors: Sarpangala Hariharakeshava Hegde, Fremont, CA (US); Vincent C. Lee, Fremont, CA (US); Wei-Hua Hsiao, St. Petersburg, FL (US); Joseph Barraco, Lutz, FL (US)

(73) Assignee: PLASMA-THERM NES LLC, St. Petersburg, FL (US)

( * ) Notice: Subject to any disclaimer, the term of this patent is extended or adjusted under 35 U.S.C. 154(b) by 0 days.

(21) Appl. No.: 17/723,005

(22) Filed: Apr. 18, 2022

(65) Prior Publication Data
US 2023/0335383 A1    Oct. 19, 2023

(51) Int. Cl.
*C23C 14/46* (2006.01)
*H01J 37/34* (2006.01)

(52) U.S. Cl.
CPC .......... *H01J 37/3417* (2013.01); *C23C 14/46* (2013.01); *H01J 37/3464* (2013.01)

(58) Field of Classification Search
CPC ... C23C 14/46; C23C 14/352; C23C 14/3492; C23C 14/3407; C23C 14/225; H01J 37/3417; H01J 37/3464; H01J 37/347
USPC ........................................ 204/298.04, 192.11
See application file for complete search history.

(56) References Cited

U.S. PATENT DOCUMENTS

| | | | |
|---|---|---|---|
| 6,045,671 A | 4/2000 | Wu et al. | |
| 6,224,718 B1 | 5/2001 | Meyer | |
| 6,395,156 B1 | 5/2002 | Hsueh et al. | |
| 6,682,634 B1 | 1/2004 | Kahn et al. | |
| 9,478,394 B2 | 10/2016 | Roque et al. | |
| 2004/0084299 A1 | 5/2004 | Slaughter et al. | |
| 2012/0080307 A1* | 4/2012 | Kameyama | H01J 37/08 204/298.36 |
| 2016/0104888 A1* | 4/2016 | Li | H01M 4/0426 429/188 |

FOREIGN PATENT DOCUMENTS

| | | | |
|---|---|---|---|
| GB | 2 228948 | * | 9/1990 |
| JP | H01275757 A | | 11/1989 |
| JP | 08-074052 | * | 3/1996 |

OTHER PUBLICATIONS

Machine Translation Nakagawa et al. JP 08-074952 (Year: 1996).*

* cited by examiner

*Primary Examiner* — Rodney G McDonald
(74) *Attorney, Agent, or Firm* — Harvey S. Kauget; Burr & Forman LLP

(57) ABSTRACT

The present disclosure provides a method for increased target utilization within a sputtering system. A plurality of targets are provided wherein each target is operatively connected to a central axis. An ion beam is generated within the sputtering system. The generated ion beam is directed at a first location of a first target for a first time period. Each target is moved by rotating the central axis. The generated ion beam is directed at a second location of the first target for a second time period.

20 Claims, 6 Drawing Sheets

ION BEAM DEPOSITION TARGET LIFE ENHANCEMENT

TECHNICAL FIELD

The present disclosure relates to the field of charged particle sources including plasma sources for direct deposition, broad-beam ion sources for ion beam deposition and electron sources for surface modification.

BACKGROUND

FIG. 1 illustrates an ion deposition (IBD) system. In this IBD system 10, a plurality of targets 20 held on target holders 25 are positioned on a pallet 50 that is connected to a motor at a central point. The targets 20 rotate around a central axis 30 through the motor. One target 20 is brought into positioned so that it is placed in front of an ion source. A wafer can be exposed to sputtered material from the target 20. Ion source can be comprised of a plasma chamber and an ion extraction grid system. Plasma in the plasma source may be generated by methods known in the art including direct current (DC) and radio frequency (RF) inductively coupled plasma (ICP) coils. The energy of the ions extracted from the ion source is defined by the voltages applied to the grid system.

SUMMARY OF THE INVENTION

In accordance with an embodiment, the present disclosure relates to offsetting a target relative to the central axis of a collimated ion beam in a multi-target ion beam deposition system so that a greater area of the target is used.

According to one aspect of an embodiment of the present disclosure, a method for increased target utilization within a sputtering system comprising the steps of: providing a plurality of targets, each target is operatively connected to a central axis; generating a first ion beam within the sputtering system; directing the first generated ion beam at a first location of a first target; discontinuing the generation of the first ion beam; moving each target by rotating the central axis; generating a second ion beam within the sputtering system; and directing the second generated ion beam at a second location of said first target.

According to another aspect of an embodiment of the present disclosure, a method for increased target utilization within a sputtering system comprising the steps of: providing a plurality of targets, each target is operatively connected to a central axis; generating an ion beam within the sputtering system; directing the generated ion beam at a first location of a first target for a first time period; moving each target by rotating the central axis; and directing the generated ion beam at a second location of said first target for a second time period.

According to another aspect of an embodiment of the present disclosure, a method for increased target utilization within a sputtering system comprising the steps of: providing a plurality of targets, each target is operatively connected to a central axis; generating an ion beam within the sputtering system; directing the generated ion beam at a first location of a first target; exposing a first substrate to sputtered material from said first location of said first target; moving each target by rotating the central axis; directing the generated ion beam at a second location of said first target; and exposing a second substrate to sputtered material from said second location of said first target.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

Similar reference characters refer to similar parts throughout the several views of the drawings.

DETAILED DESCRIPTION

Figure 1:
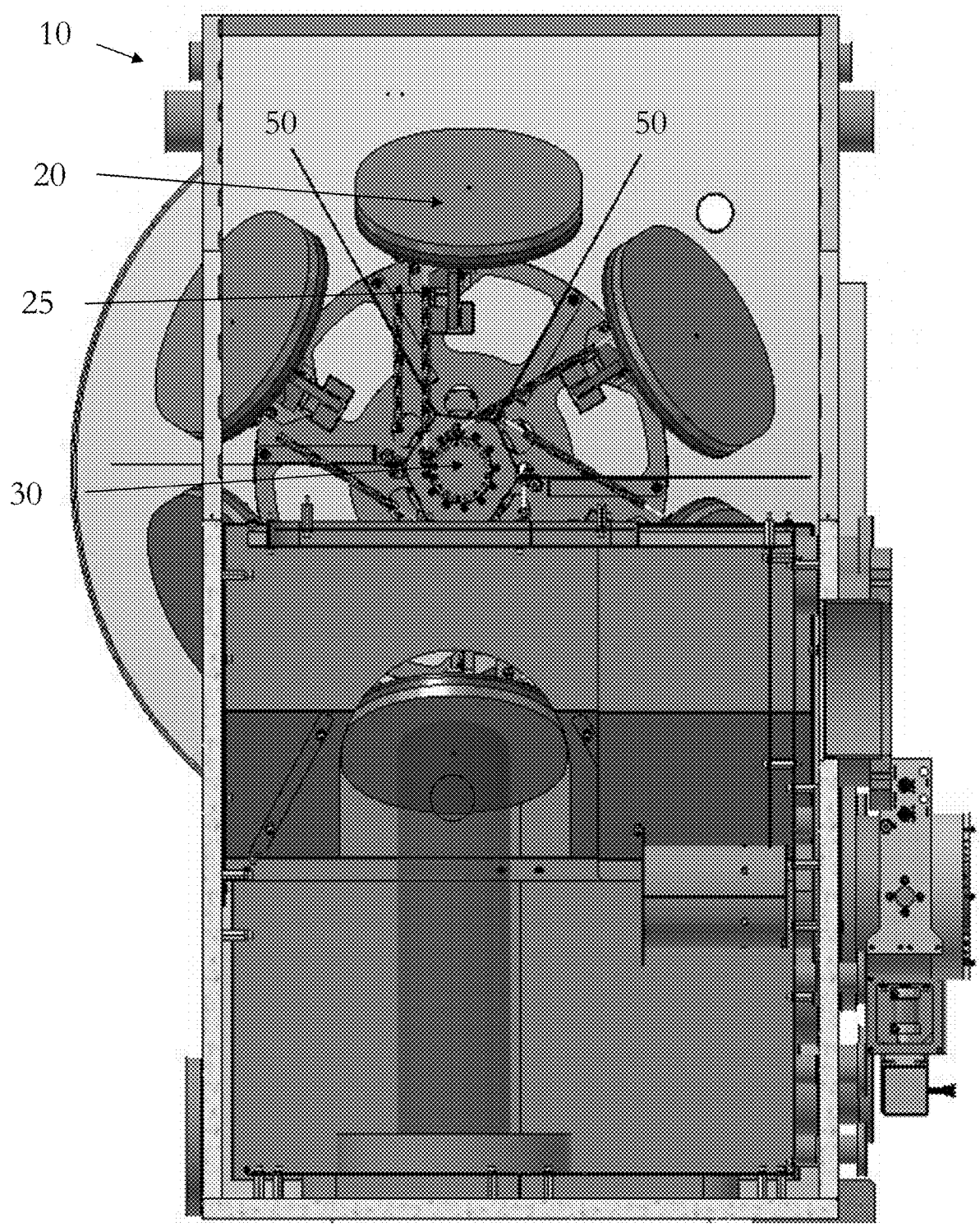
FIG. 1 illustrates an ion beam deposition system.
Figure 2A:
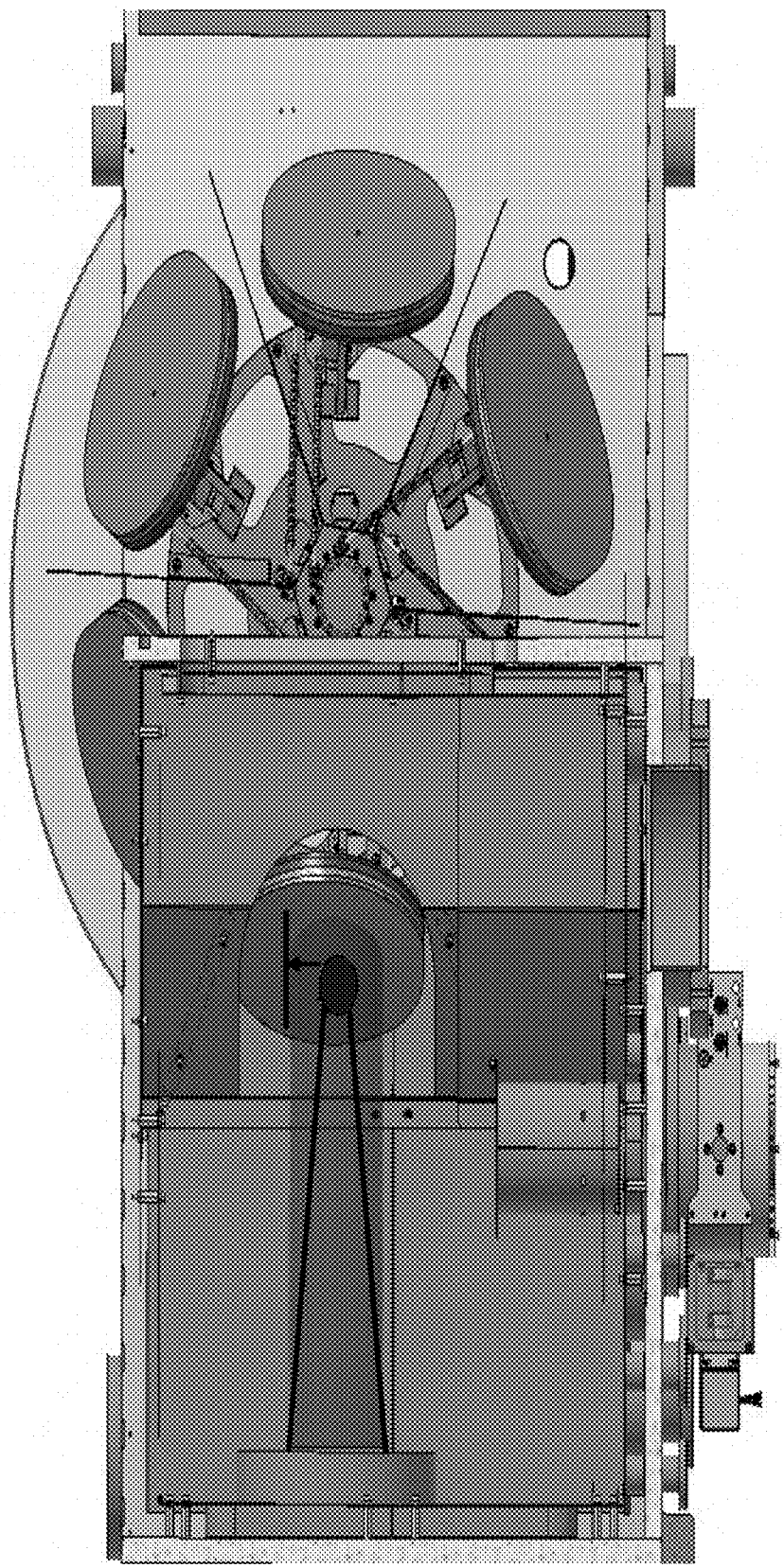
FIG. 2A illustrates an ion beam deposition system with the target offset to the left of nominal index position.
Figure 2B:
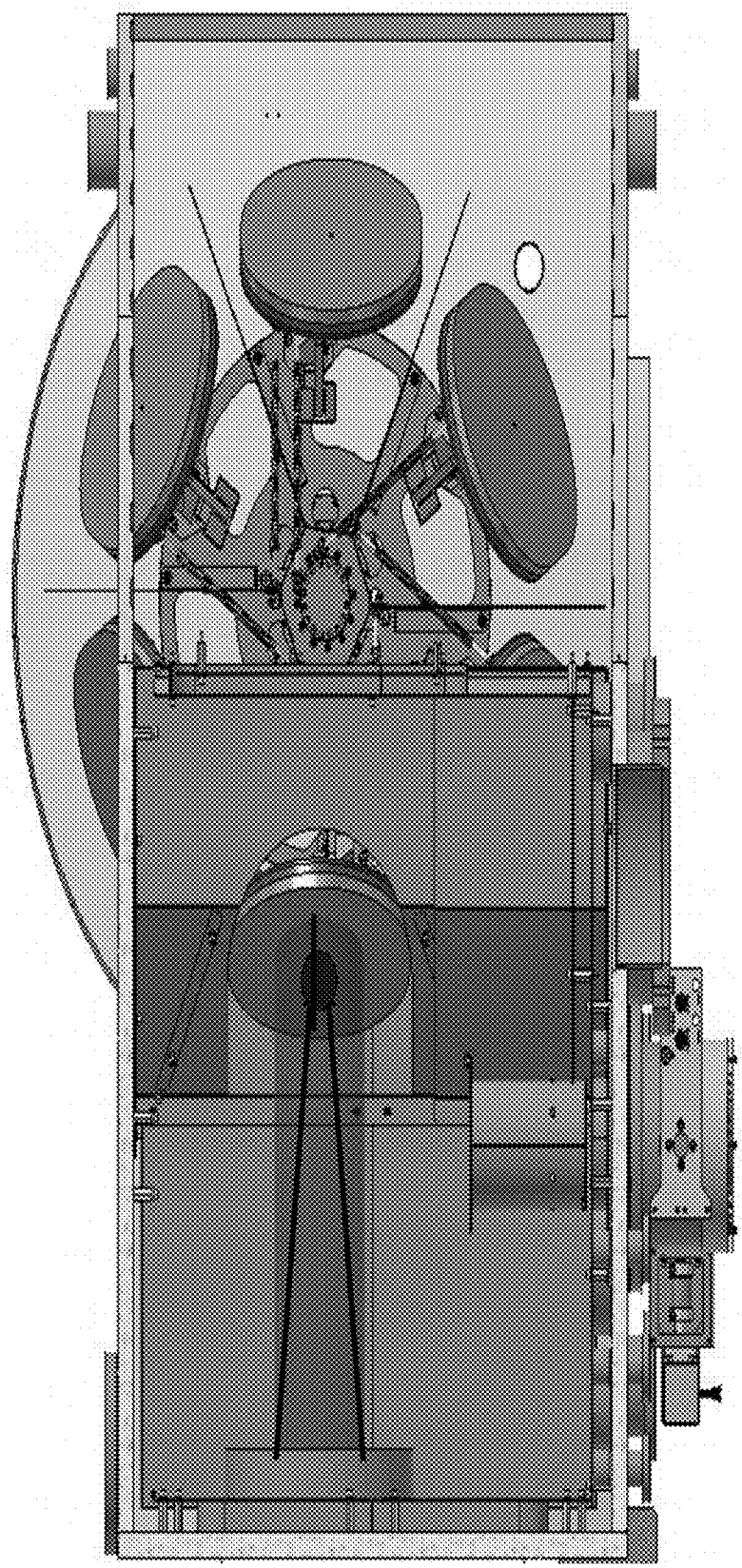
FIG. 2B illustrates an ion beam deposition system with the target at nominal index position.
Figure 2C:
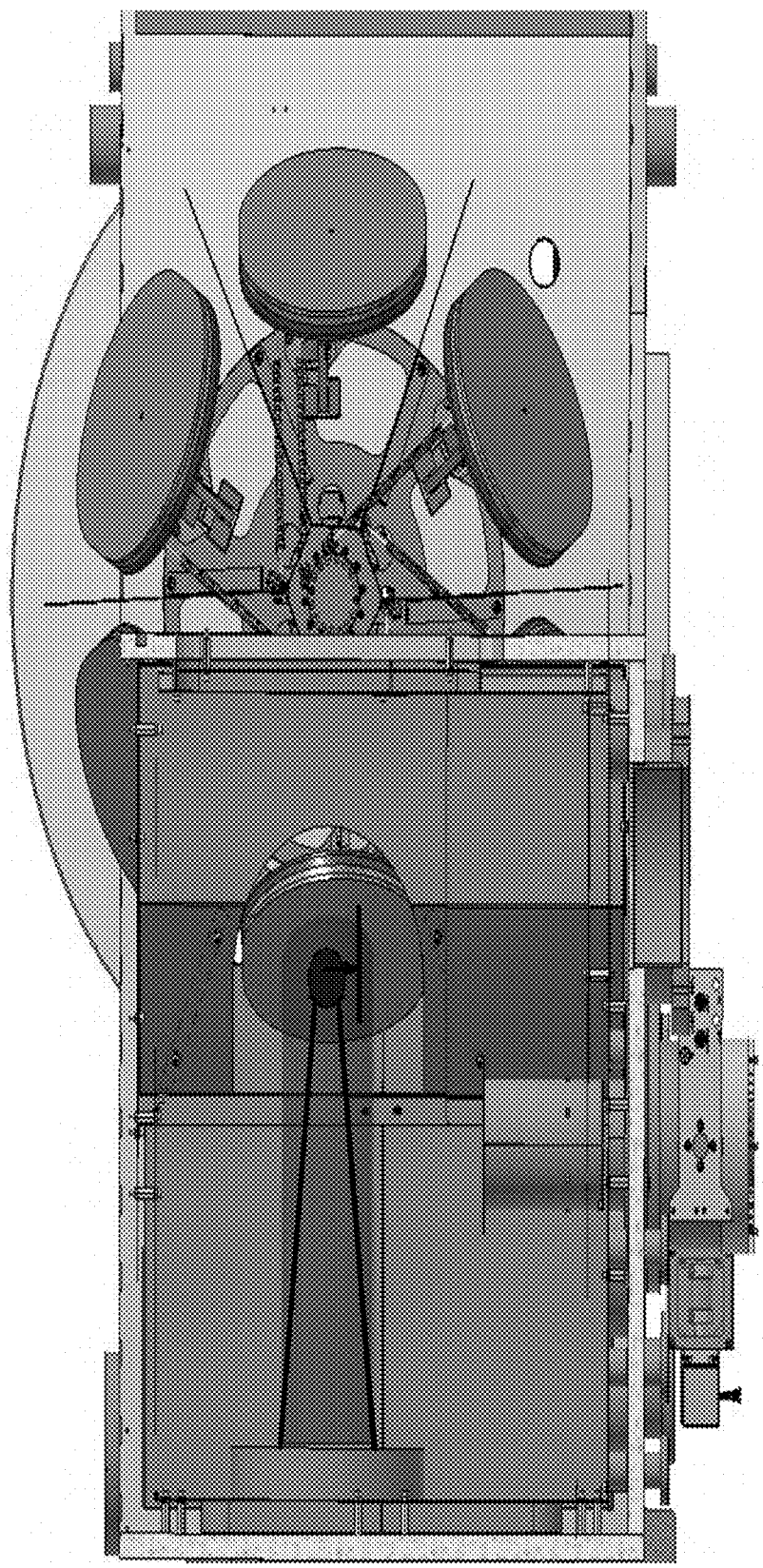
FIG. 2C illustrates an ion beam deposition system with the target offset to the right of nominal index position.
Figure 3A:
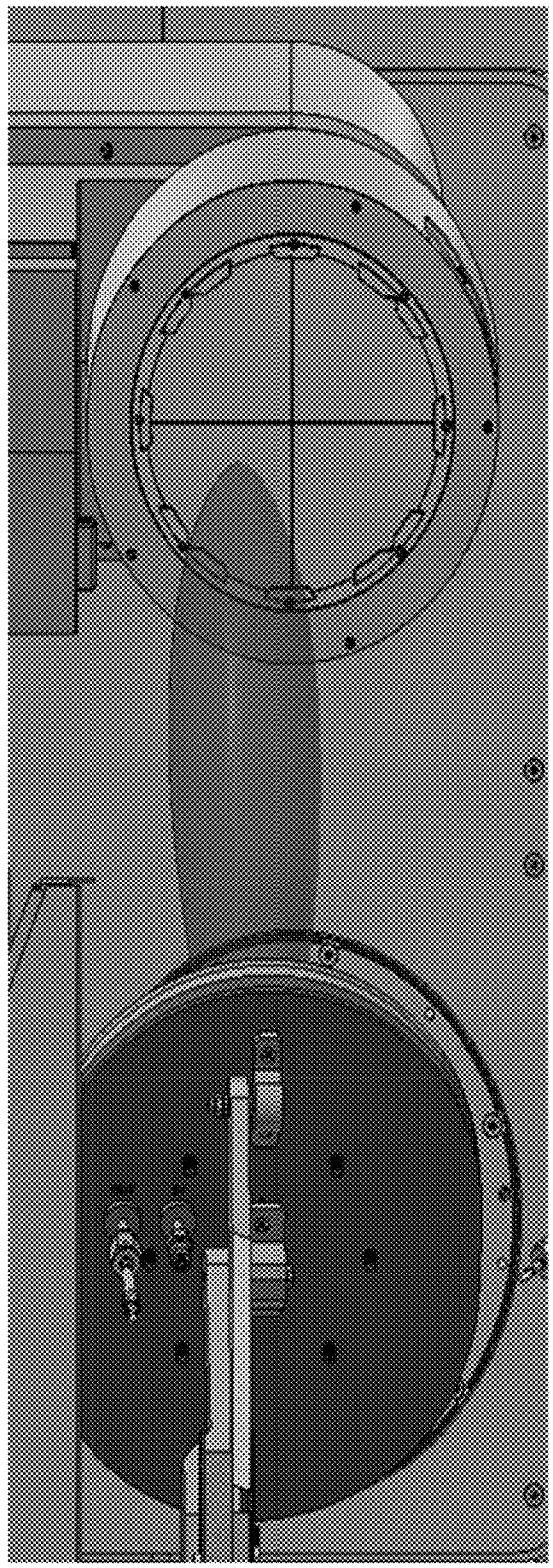
FIG. 3A illustrates an ion beam hitting the target offset to the left of nominal index position.
Figure 3B:
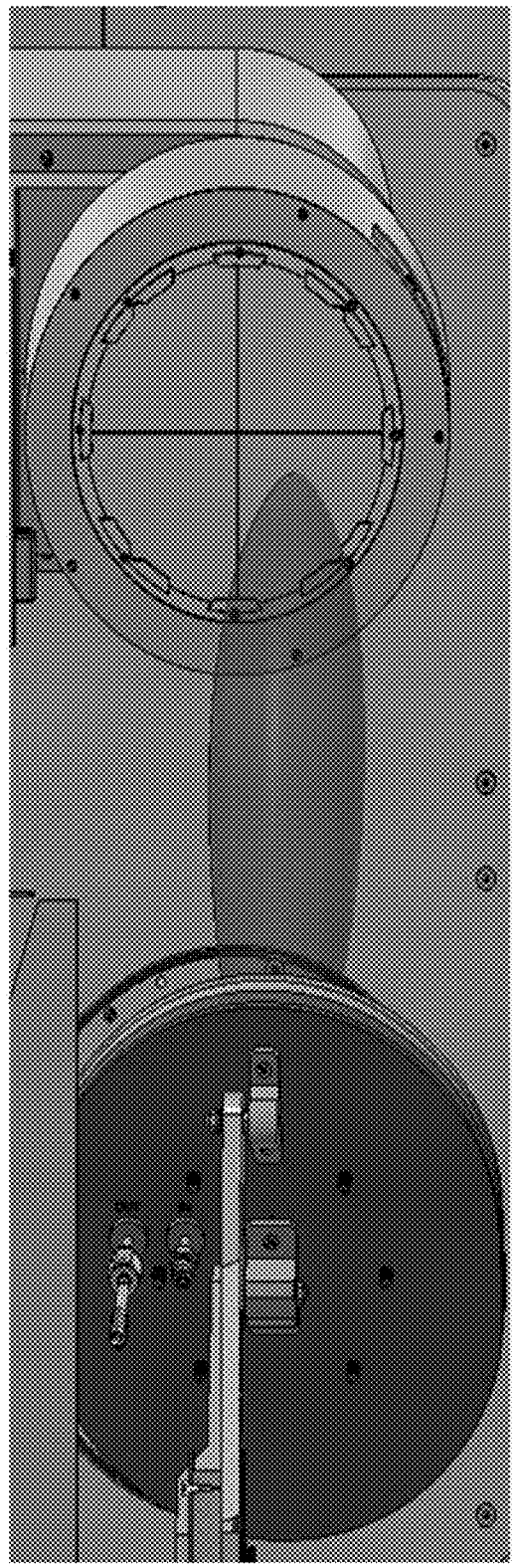
FIG. 3B illustrates an ion beam hitting the target offset to the right of nominal index position.
Figure 4A:
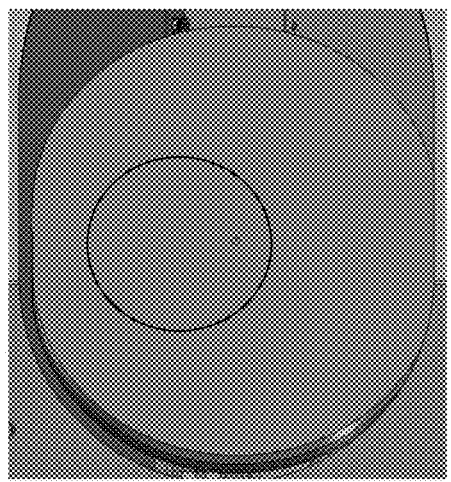
FIG. 4A illustrates target erosion when the ion beam hits the target offset to the left of nominal position.
Figure 4B:
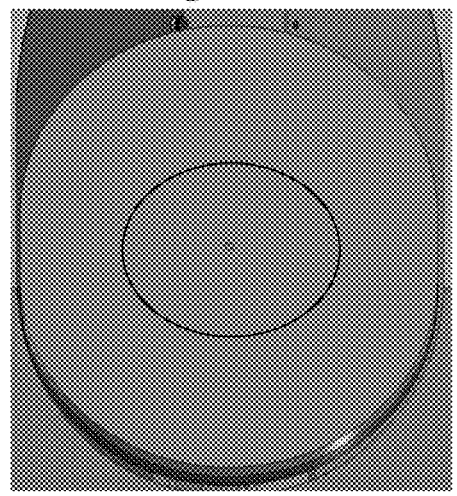
FIG. 4B illustrates target erosion when the ion beam hits the target at nominal position.
Figure 4C:
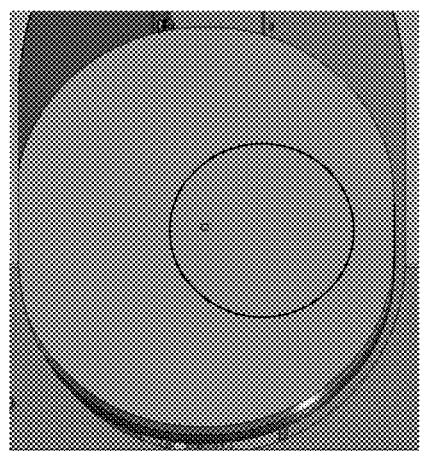
FIG. 4C illustrates target erosion when the ion beam hits the target offset to the right of nominal position.

Target costs, and frequency of target replacements are major drivers of high cost of ownership of Ion Beam Deposition (IBD) systems. Typically, 99.7% of the ion beam containment is within a central portion that is half the diameter of IBD target. Thus, target utilization is very low, typically less than 15%. This low target utilization results in:
1. low mean time before maintenance and more frequent maintenance;
2. reduced tool utilization due to time required to replace the target;
3. ultra high vacuum recovery time; and
4. time for system re-qualification.

Enhanced target utilization provides significant cost of ownership benefits through:
1. lower cost of targets due to enhanced target utilization; and
2. increased tool availability.

In the present invention, target utilization is increased by offsetting the target from nominal position of the ion beam. This offset of the ion beam on the target shifts the maximum intensity of the sputter plume symmetrically either to the left or to the right of the wafer center. Since there is a symmetrical shift from both left and right, deposition rate, deposition uniformity, and other film properties are not impacted by the target life enhancement method of the present invention.

The present invention for increasing target utilization does not require complex hardware. In the prior art, target position is continuously swept between the offset positions to enhance the target life. However, this method causes premature failure of target indexing hardware and target cooling water dynamic seals. Unlike continuous sweep of the target for enhancing target life, the method of the present invention doesn't cause premature failure of target indexing hardware, and target cooling water dynamic seals.

In one embodiment according the present invention, a controlled offset of the target index position in opposing directions from the nominal index position for successive runs. IBD system control can allow offset values in steps of 0.025 inches or 0.1 degrees when measured at the target turret rotation axis.

In another embodiment of the present invention, each deposition step can be divided into two equal parts, each at opposing offset values from the nominal position. IBD system control can allow process step size as small as 0.1 seconds.

In another embodiment of the present invention, Kilo-Watt-Hour of ion beam exposure on the target can be adjusted to match offsets on opposing directions from nominal index position of the target.

In one embodiment according to the present invention, increased target utilization within a sputtering system 10 is achieved using a method wherein a plurality of targets 20, each held by a target holder 25, are positioned along the outer portion of a generally circular pallet 50 that has a central axis 30 that is connected to a motor that rotates the pallet 50 in a generally circular motion thereby rotating the plurality of targets 20 in a generally circular motion. A first ion beam is generated within the sputtering system 10 that is directed at a first location of a first target 20. The first location on the first target 20 can be nominal to the first ion beam, offset to the left of the nominal position of the first ion beam or offset to the right of the nominal position of the first ion beam. After a time period of exposing the first location of the first target 20 to the first ion beam, the first ion beam is turn off (discontinued). The time period can range from 0.5 seconds to any time period with time periods of at least 1 to 5 seconds being preferred. After the first ion beam is turned off, the pallet 50 of plurality of targets 20 is rotated by the motor that turns the central axis 30 of the pallet 50 thereby moving each target 20 by rotating the central axis 30. A second ion beam is generated within the sputtering system 10 that is directed at a second location of said first target 20. The second location of said first target 20 can be offset from the first location of said first target 20 by a distance having a range of 1 mm to 50 mm. Alternatively, the rotation movement of the central axis 30 can be by 0.16 degrees to 8 degrees. The first generated ion beam and the second generated ion beam can be applied to said first location of said first target 20 and to said second location of said first target 20 for an equal time and can be applied with the same process conditions. Alternatively, the first generated ion beam and the second generated ion beam can be applied to said first location of said first target 20 and to said second location of said first target 20 for different amounts of time and can be applied with different process conditions.

In one embodiment according to the present invention, increased target utilization within a sputtering system 10 is achieved using a method wherein a plurality of targets 20, each held by a target holder 25, are positioned along the outer portion of a generally circular pallet 50 that has a central axis 30 that is connected to a motor that rotates the pallet 50 in a generally circular motion thereby rotating the plurality of targets 20 in a generally circular motion. An ion beam is generated within the sputtering system 10 that is directed at a first location of a first target 20 for a first time period. The first location on the first target 20 can be nominal to the ion beam, offset to the left of the nominal position of the ion beam or offset to the right of the nominal position of the ion beam. After the first time period of exposing the first location of the first target 20 to the ion beam, the pallet 50 of plurality of targets 20 is rotated by the motor that turns the central axis 30 of the pallet 50 thereby moving each target 20 by rotating the central axis 30. The first time period can range from 0.5 seconds to any time period with time periods of at least 1 to 5 seconds being preferred. A second location of said first target 20 is exposed to the ion beam for a second time period. The second location on the first target 20 can be nominal to the ion beam, offset to the left of the nominal position of the ion beam or offset to the right of the nominal position of the ion beam. After the second time period of exposing the second location of the first target 20 to the ion beam, the pallet 50 of plurality of targets 20 is rotated by the motor that turns the central axis 30 of the pallet 50 thereby moving each target 20 by rotating the central axis 30. The second time period can range from 0.5 seconds to any time period with time periods of at least 1 to 5 seconds being preferred. The second location of said first target 20 can be offset from the first location of said first target 20 by a distance having a range of 1 mm to 50 mm. Alternatively, the rotation movement of the central axis 30 can be by 0.16 degrees to 8 degrees. The generated ion beam can be applied to said first location of said first target 20 and to said second location of said first target 20 for an equal time and can be applied with the same process conditions. Alternatively, the generated ion beam can be applied to said first location of said first target 20 and to said second location of said first target 20 for different amounts of time and can be applied with different process conditions.

In one embodiment according to the present invention, increased target utilization within a sputtering system 10 is achieved using a method wherein a plurality of targets 20, each held by a target holder 25, are positioned along the outer portion of a generally circular pallet 50 that has a central axis 30 that is connected to a motor that rotates the pallet 50 in a generally circular motion thereby rotating the plurality of targets 20 in a generally circular motion. An ion beam is generated within the sputtering system 10 that is directed at a first location of a first target 20 for a first time period. The first location on the first target 20 can be nominal to the ion beam, offset to the left of the nominal position of the ion beam or offset to the right of the nominal position of the ion beam. A first substrate is exposed to sputtered material from said first location of said first target 20 during the first time period. After the first time period of exposing the first location of the first target 20 to the ion beam, the pallet 50 of plurality of targets 20 is rotated by the motor that turns the central axis 30 of the pallet 50 thereby moving each target 20 by rotating the central axis 30. The first time period can range from 0.5 seconds to any time period with time periods of at least 1 to 5 seconds being preferred. After the first time period, the first substrate can be removed from the sputtering system 10 before any other substrate is exposed to an ion beam. A second location of said first target 20 is exposed to the ion beam for a second time period. The second location on the first target 20 can be nominal to the ion beam, offset to the left of the nominal position of the ion beam or offset to the right of the nominal position of the ion beam. A second substrate is exposed to sputtered material from said second location of said first target 20 during the second time period. After the second time period of exposing the second location of the first target 20 to the ion beam, the pallet 50 of plurality of targets 20 is rotated by the motor that turns the central axis 30 of the pallet 50 thereby moving each target 20 by rotating the central axis 30. The second time period can range from 0.5 seconds to any time period with time periods of at least 1 to 5 seconds being preferred. The second location of said first target 20 can be offset from the first location of said first target 20 by a distance having a range of 1 mm to 50 mm. Alternatively, the rotation movement of the central axis 30 can be by 0.16 degrees to 8 degrees. The generated ion beam can be applied to said first location of said first target 20 and to said second location of said first target 20 for an equal time and can be applied with the same process conditions. Alternatively, the generated ion beam can be applied to said first location of said first target 20 and to said second location of said first target 20 for different amounts of time and can be applied with different process conditions.

In any embodiment of the present invention, the stage that hold the wafer during exposure to the sputtered material from the target can rotate the wafer about a central axis. The stage can tilt the wafer with respect to the sputtered material for at least a portion of the deposition process. The deposition plume of sputtered material from the target can be directed at any angle with respect to the wafer surface by tilting the wafer stage. Provisions may be made on the wafer stage to cool the wafer during the deposition process to prevent thermal damage to the devices on the wafer. The wafer may also be heated to a specific temperature to enhance the ion beam deposition process.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further, and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

What is claimed is:

1. A method for increased target utilization within a sputtering system comprising the steps of:
    providing a plurality of targets, each target of the plurality of targets is operatively connected to a target holder, each target of the plurality of targets is positioned along an outer portion of a generally circular pallet of the sputtering system, the circular pallet having a central axis;
    generating a first ion beam within the sputtering system;
    directing the first generated ion beam at a first location of a first target;
    discontinuing the generation of the first ion beam;
    rotating the central axis of the circular pallet;
    generating a second ion beam within the sputtering system; and
    directing the second generated ion beam at a second location of said first target.

2. The method of claim 1 wherein said first location of said first target is offset from said second location of said first target by a distance having a range of 1 mm to 50 mm.

3. The method of claim 1 wherein the rotation of the central axis is by 0.16 degrees to 8 degrees.

4. The method of claim 1 wherein the first generated ion beam and the second generated ion beam are applied to said first target for an equal time.

5. The method of claim 1 wherein the first generated ion beam and the second generated ion beam are applied to said first target with same process conditions.

6. The method of claim 1 wherein the first generated ion beam and the second generated ion beam are applied to said first target for different amounts of time.

7. The method of claim 1 wherein the first generated ion beam and the second generated ion beam are applied to said first target with different process conditions.

8. A method for increased target utilization within a sputtering system comprising the steps of:
    providing a plurality of targets, each target of the plurality of targets is operatively connected to a target holder, each target of the plurality of targets is positioned along an outer portion of a generally circular pallet of the sputtering system, the circular pallet having a central axis;
    generating an ion beam within the sputtering system;
    directing the generated ion beam at a first location of a first target for a first time period;
    rotating the central axis of the circular pallet; and
    directing the generated ion beam at a second location of said first target for a second time period.

9. The method of claim 8 wherein said first location of said first target is offset from said second location of said first target by a distance having a range of 1 mm to 50 mm.

10. The method of claim 8 wherein the rotation of the central axis is by 0.16 degrees to 8 degrees.

11. The method of claim 8 wherein the first time period is at least 0.5 seconds.

12. The method of claim 11 wherein the second time period is at least 0.5 seconds.

13. The method of claim 8 wherein the first time period is at least 1 second.

14. The method of claim 13 wherein the second time period is at least 1 second.

15. The method of claim 8 wherein the first time period is at least 2 seconds.

16. The method of claim 15 wherein the second time period is at least 2 seconds.

17. A method for increased target utilization within a sputtering system comprising the steps of:
    providing a plurality of targets, each target of the plurality of targets is operatively connected to a target holder, each target of the plurality of targets is positioned along an outer portion of a generally circular pallet of the sputtering system, the circular pallet having a central axis;
    generating an ion beam within the sputtering system;
    directing the generated ion beam at a first location of a first target;
    exposing a first substrate to sputtered material from said first location of said first target;
    rotating the central axis of the circular pallet;

directing the generated ion beam at a second location of said first target; and exposing a second substrate to sputtered material from said second location of said first target.

18. The method of claim 17 wherein said first location of said first target is offset from said second location of said first target by a distance having a range of 1 mm to 50 mm.

19. The method of claim 17 wherein the rotation of the central axis is by 0.16 degrees to 8 degrees.

20. The method of claim 17 further comprising removing said first substrate from the sputtering system before exposing said second substrate to sputtered material from said second location of said first target.

* * * * *